United States Patent
Kang

(10) Patent No.: US 7,505,087 B2
(45) Date of Patent: Mar. 17, 2009

(54) BROADCAST RECEIVER AND TUNER CONTROL METHOD THEREFOR

(75) Inventor: Seok Pan Kang, Goomi-si (KR)

(73) Assignee: LG Electronics Inc., Seoul (KR)

( * ) Notice: Subject to any disclaimer, the term of this patent is extended or adjusted under 35 U.S.C. 154(b) by 578 days.

(21) Appl. No.: 11/201,126

(22) Filed: Aug. 11, 2005

(65) Prior Publication Data

US 2006/0050179 A1 Mar. 9, 2006

(30) Foreign Application Priority Data

Sep. 3, 2004 (KR) .................. 10-2004-0070306

(51) Int. Cl.
 *H04N 5/50* (2006.01)
 *H04N 5/45* (2006.01)
(52) U.S. Cl. .................. 348/731; 348/565; 348/726
(58) Field of Classification Search .......... 348/564, 348/565, 731, 588, 569, 598, 725, 726; *H04N 5/445, H04N 5/45, 5/50, 9/74, 5/44, 5/455*
See application file for complete search history.

(56) References Cited

U.S. PATENT DOCUMENTS

| | | | | |
|---|---|---|---|---|
| 5,867,227 A | * | 2/1999 | Yamaguchi | 348/565 |
| 6,603,517 B1 | * | 8/2003 | Shen et al. | 348/565 |
| 6,665,017 B1 | * | 12/2003 | Raiyat | 348/564 |
| 2004/0111744 A1 | * | 6/2004 | Bae et al. | 348/731 |

* cited by examiner

*Primary Examiner*—Sherrie Hsia
(74) *Attorney, Agent, or Firm*—Ked & Associates, LLP

(57) ABSTRACT

Embodiments of broadcasting receiver and methods for the same can operate two or more tuners or simultaneously display broadcasting signals of two or more channels. Embodiments of the invention can reduce system interference. A broadcasting receiver can include a plurality of tuners, and a controller for operating a tuner of a broadcasting signal not being displayed using an oscillation frequency that has reduced or avoids interference with another tuner of a currently selected and displayed broadcasting signal. For example, an interference controller can read stored PLL data with reference to a channel frequency of a currently selected and displayed broadcasting signal and write the read PLL data in other tuner(s) when only a broadcasting signal received by one of the tuners is currently selected and displayed.

20 Claims, 6 Drawing Sheets

BROADCAST RECEIVER AND TUNER CONTROL METHOD THEREFOR

BACKGROUND OF THE INVENTION

1. Field of the Invention

The present invention relates to a broadcasting receiver and a tuner control method therefore.

2. Background of the Related Art

In a related art broadcasting receiver, a tuner selects a radio frequency (RF) signal of a desired channel among RF signals received from an antenna and converts the selected RF signal into a intermediate frequency (IF) signal, and a demodulator demodulates the IF signal. Then, a picture of the demodulated selected channel is displayed on a screen of the broadcast receiving apparatus.

In a broadcasting receiver having a picture-in-picture (PIP) function, a main tuner and a sub tuner respectively select RF signals of desired channels among RF signals received from an antenna and respectively convert the selected RF signals into IF signals. Thereafter, corresponding demodulators respectively demodulate the IF signals, and pictures of the selected channels are respectively displayed in a main area and a PIP area on a screen of the broadcast receiving apparatus.

As described above, related art broadcasting receives have various disadvantages. For example, in related art broadcasting receivers with the PIP function, interference can occur between the main tuner and the sub tuner during operations. Such interference can adversely effect the performance of the broadcasting receiver.

The above references are incorporated by reference herein where appropriate for appropriate teachings of additional or alternative details, features and/or technical background.

SUMMARY OF THE INVENTION

An object of the invention is to solve at least related art problems and/or disadvantages and to provide at least the advantages described hereinafter.

Another object of the invention is to provide a broadcasting receiver and a tuner control method therefore that substantially obviate one or more problems caused by limitations and disadvantages of the related art.

Another object of the invention is to provide a broadcasting receiver having at least two or more tuners such as a main tuner and a sub tuner, and a tuner control method capable of controlling a frequency interference between the tuners.

Another object of the invention is to provide a broadcasting receiver having at least two or more tuners such as a main tuner and a sub tuner, and a tuner control method therefore capable of reducing or preventing a frequency interference in the main tuner caused by the sub tuner when the function of the sub tuner is off.

To achieve at least these objects and other advantages in a whole or in part and in accordance with the purpose of the invention, as embodied and broadly described herein, there is provided a broadcasting receiver having at least two tuners and a function capable of simultaneously displaying broadcasting signals of at least two channels, the broadcasting receiver can include a plurality of tuners configured to convert RF signals selected among a plurality of received RF signals into IF signals, a plurality of demodulators configured to demodulate the IF signals from the tuners to output video signals and an interference controller configured to read data used to control oscillation frequencies for respective channels to select a specific channel with reference to a channel frequency of a currently selected and displayed broadcasting signal and operate at least one other tuner according to the read data when a broadcasting signal received by the at least one other tuner is not displayed.

In another aspect of the present invention, there is provided a broadcasting receiver having a plurality of tuners and a function capable of simultaneously displaying a first broadcasting signal and a second broadcasting signal respectively on first and second areas into which a display screen is configured to be divided, the broadcasting receiver can include main and sub tuners configured to convert RF signals selected among a plurality of RF signals received from an antenna into IF signals and amplify the IF signals, main and sub demodulators configured to demodulate the IF signals from the tuners to output video signals and an interference controller configured to store PLL data used to control oscillation frequencies to select specific channels and read corresponding PLL data selected to reduce interference caused by a channel frequency of the main tuner and write the corresponding PLL data in the sub tuner when a broadcasting signal output by the sub tuner is not displayed.

In further another aspect of the present invention, there is provided a tuner control method for a broadcasting receiver having a multi-tuner, the method can include controlling a selected channel bandwidth in a first tuner of a displayed first multi-window function and controlling a second tuner of a second multi-window function with reference to the selected channel bandwidth when the second multi-window function is not displayed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
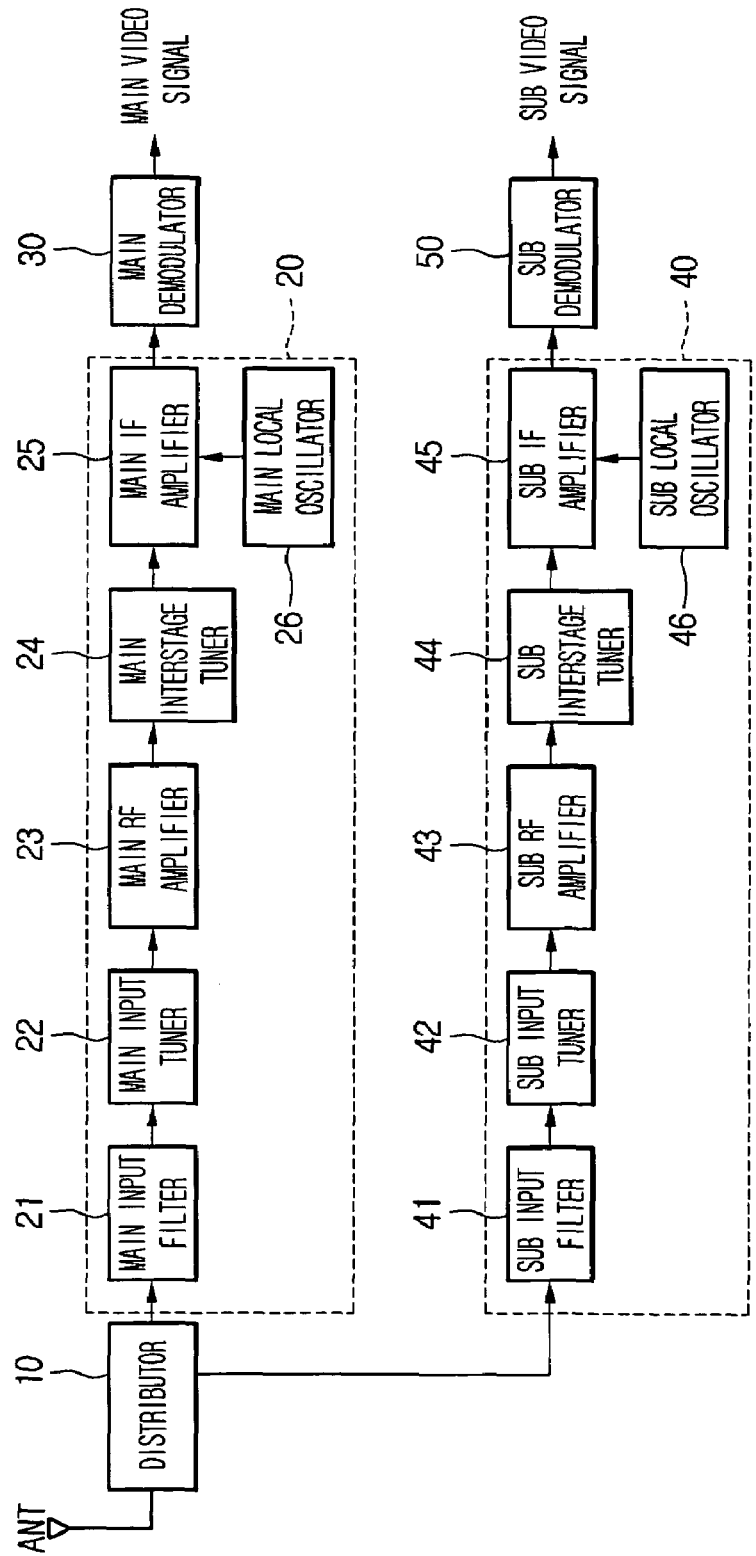
FIG. 1 is a block diagram of a tuner in a related art broadcasting receiver having a PIP function.

FIG. 1 is a block diagram of a tuner in a related art broadcasting receiver having a PIP function. As shown in FIG. 1, a tuner includes a distributor 10, a main tuner 20, a main demodulator 30, a sub tuner 40, and a sub demodulator 50. The distributor 10 distributes a plurality of RF signals from an antenna to a plurality of lines.

The main tuner 20 includes a main input filter 21, a main input tuner 22, a main RF amplifier 23, a main interstage tuner 24, a main IF amplifier 25 and a main local oscillator 26. The sub tuner 40 includes a sub input filter 41, a sub input tuner 42, a sub RF amplifier 43, a sub interstage tuner 44, a sub IF amplifier 45, and a sub local oscillator 46.

The main tuner 20 selects only a RF signal of a desired main channel among the distributed RF signals, converts the selected RF signal into an IF signal, and amplifies the IF signal. The main demodulator 30 demodulates the amplified IF signal so that the amplified IF signal can be displayed on a main screen of the broadcasting receiver.

The sub tuner 40 selects only a RF signal of a desired sub channel among the distributed RF signals, converts the selected RF signal into an IF signal, and amplifies the IF signal. The sub demodulator 50 demodulates the amplified IF signal from the desired sub channel so that the amplified IF signal can be displayed on a sub screen of the broadcasting receiver.

The main tuner 20 and the sub tuner 40 respectively select desired channel frequencies by using phase locked loop (PLL) data. The PLL data are respective broadcast channel frequency data for forcibly tuning respective broadcast channels.

The main tuner 20 and the sub tuner 40 respectively control the main local oscillator 26 and the sub local oscillator 46 to thereby output desired oscillation frequencies. In the tuner of the related art broadcasting receiver of FIG. 1, phases of the desired oscillation frequencies can be fixed with reference to the PLL data.

The main input filter 21 of the main tuner 20 filters off a noise component of the distributed RF signal from the distributor 10. The main input tuner 22 primarily tunes the filtered RF signal from the main input filter 21.

The main RF amplifier 23 amplifies the tuned RF signal from the main input tuner 22. The main interstage tuner 24 secondarily and finely tunes the amplified RF signal from the main RF amplifier 23.

The main IF amplifier 25 mixes the tuned RF signal from the main interstage tuner 24 and an oscillation frequency signal from the main local oscillator 26. The main IF amplifier 25 converts and amplifies an audio signal and a video signal respectively into a 41.25 MHz IF signal and a 45.75 MHz IF signal, and then outputs the resulting IF signals to the main demodulator 30.

The main local oscillator 26 outputs a desired oscillation frequency, and is operated to convert a selected RF into an IF signal. The main local oscillator 26 can output a local oscillator signal to the main amplifier 25.

Operations of the sub tuner 40 are similar to the main tuner 20. Accordingly, a detailed description is omitted.

When the PIP function of the broadcasting receiver is on and an interval between a main channel and a sub channel is 7 channels, a local oscillation frequency of the sub local oscillator 46 may be contained in a video signal bandwidth of an IF of the main channel, which can cause an interference between a main picture and a sub picture. The interference is generated because a frequency bandwidth between respective channels is 6 MHz.

For example, a video carrier is 507.25 MHz (e.g., local oscillation frequency: 553 MHz) when a 20th channel is received on a main channel in a UHF bandwidth, and a video carrier is 549.25 MHz (e.g., local oscillation frequency: 595 MHz) when a twenty-seventh channel is received on a sub channel. At this time, a frequency difference of 42 MHz between the local oscillation frequency (553 MHz) of the main channel and the local oscillation frequency (595 MHz) of the sub channel can interfere with a video IF of 45.75 MHz.

Such an interference can be continuously generated even when the PIP function is off, because the PLL data of a channel selected (e.g., before the PIP function is turned off) is continuously written in the sub tuner 40 and the sub local oscillator 46 is also continuously operated. Accordingly, the interference with the main picture can be continuously maintained, which can deteriorate a picture quality. For example, a noise can be generated in the main picture.

Figure 2:
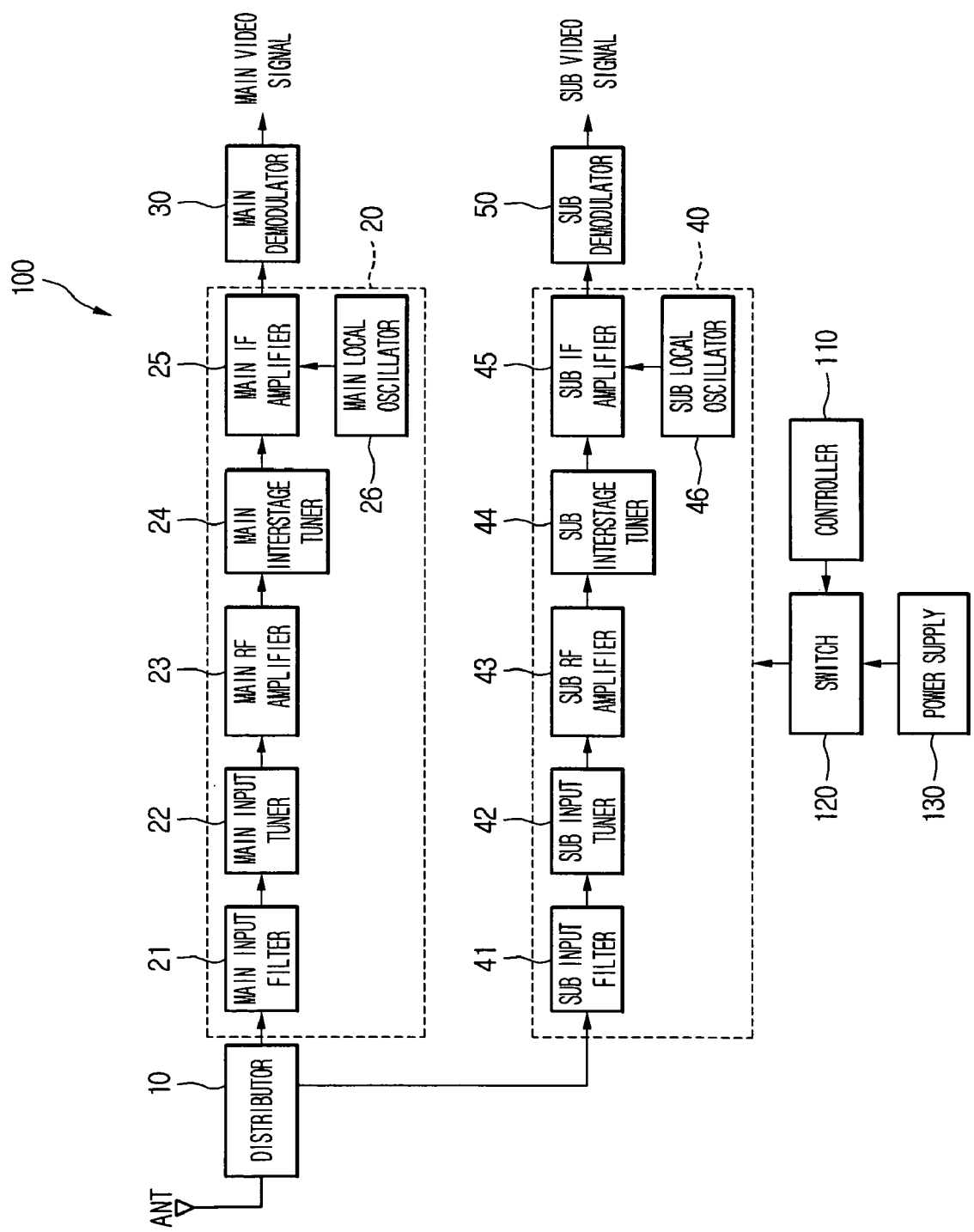
FIG. 2 is a block diagram of a tuner in another related art broadcasting receiver.

FIG. 2 is a block diagram of a tuner in another related art broadcasting receiver for solving the interference problem described in the broadcasting receiver of FIG. 1. As shown in FIG. 2, a tuner 100 includes a switch 120 in comparison with the tuner shown in FIG. 1.

A controller 110 determines whether or not a PIP function is performed. When the PIP function is performed, the related components in FIG. 2 are operated in the same manner as those in FIG. 1.

Otherwise, when the PIP function is not performed, the controller 110 outputs a switching-off control signal to the switch 120. The switch 120 is connected between the sub tuner 40 and a power supply 130, and is turned off in response to the switching-off control signal from the controller 110 to block power supply from the power supply 130 to the sub tuner 40. Accordingly, the sub tuner 40 is not operated. Further, when the PIP function is performed again, the controller 110 turns on the switch 120, and the sub tuner 40 is normally operated.

As described above, related art broadcasting receivers have various disadvantages. For example, the broadcasting receiver shown in FIG. 2 must additionally include components such as the switch 120 and directly control power. Thus, the system design in FIG. 2 is more complicated and costs are increased, and the reliability thereof is reduced.

In a broadcasting receiver having a main tuner and a sub tuner according to embodiments of the invention, a PLL data of the sub tuner can be adjusted when a function of the sub tuner is off, for example, a currently-set frequency bandwidth of the sub tuner can be adjusted or separated from a frequency bandwidth of a main tuner to reduce interference therebetween. In one embodiment, the currently-set frequency bandwidth of the sub tuner can be forcibly and maximally separated from a frequency bandwidth of the main tuner and thus frequency interference between the main tuner and the sub tuner can be reduced or removed.

Embodiments of a broadcasting receiver can include at least two or more tuners, can divide a display screen into a first area and a second area, and can display a first broadcasting signal and a second broadcasting signal respectively on the first and second areas using the tuners. In embodiments according to the invention, an inventive technical concept will be described in relation to the PIP function of a broadcasting receiver having two tuners (e.g., a main tuner and a sub tuner) and methods for operating the same. However, the present invention is not intended to be so limited.

For example, in a multi-tuner broadcasting receiver having a plurality of tuners for a multi-windows function according to embodiments of the invention, a frequency bandwidth of a second tuner configured to provide a multi-window function that is not being displayed can be operated to reduce interference with a frequency bandwidth of a first tuner configured to provide a multi-window function being displayed. Exemplary embodiments of the invention can operate on a plurality of display areas separately driven on a screen for a multi-tuner broadcasting receiver including a multi-windows function or a picture-on-picture (POP) function.

Figure 3:
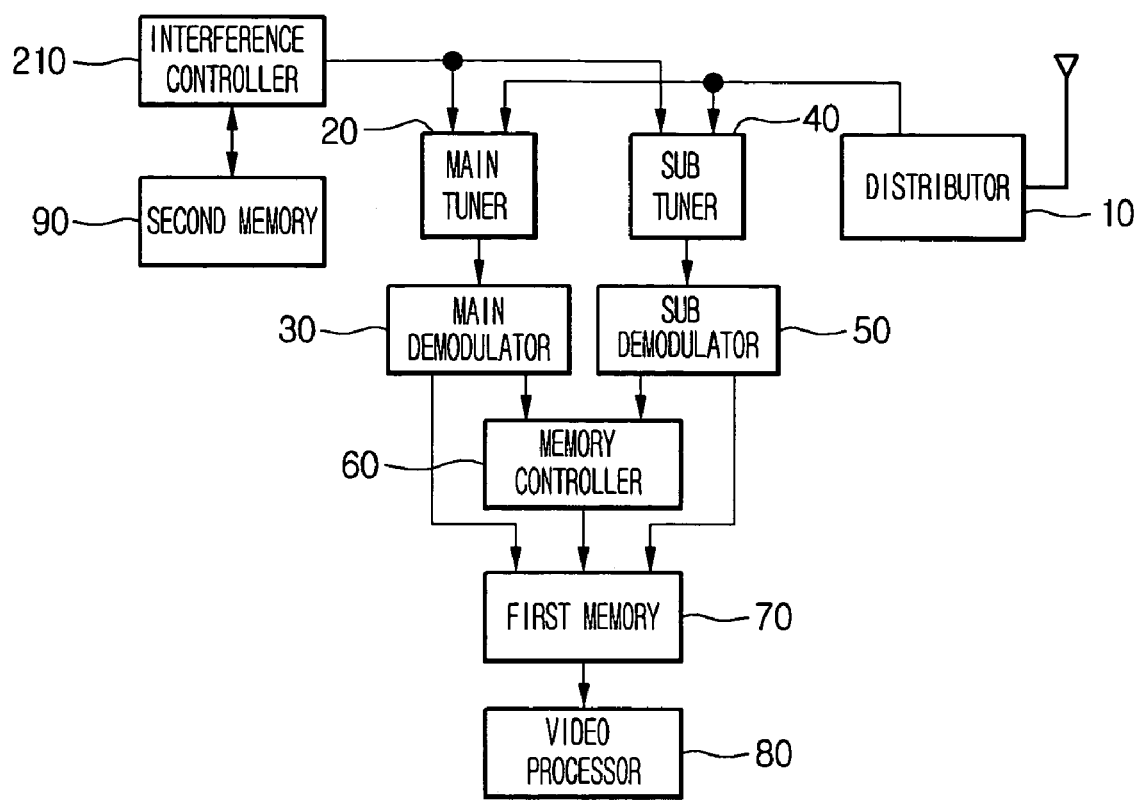
FIG. 3 is a block diagram showing an embodiment of a broadcasting receiver according to the invention.

FIG. 3 is a block diagram of an embodiment of a broadcasting receiver according to the present invention. As shown FIG. 3, the broadcasting receiver can include a distributor 10, a main tuner 20, a main demodulator 30, a sub tuner 40, a sub demodulator 50, a memory controller 60, a first memory 70, a video processor 80, a second memory 90, and an interference controller 210.

The distributor 10 can distribute a plurality of RF signals from an antenna to a plurality of lines.

The main tuner 20 can select only a RF signal of a desired main channel among the distributed RF signals, convert the selected RF signal into an IF signal, and amplify the IF signal. The main demodulator 30 can demodulate the amplified IF signal from the main tuner 20 into a baseband video signal to be displayed on a main screen of the broadcasting receiver.

The sub tuner 40 can select only a RF signal of a desired sub channel among the distributed RF signals, convert the selected RF signal into an IF signal, and amplify the IF signal. The sub demodulator 50 can demodulate the amplified IF signal from the sub tuner 40 into a baseband video signal to be displayed on a sub screen of the broadcasting receiver.

The memory controller 60 can store the baseband video signals (e.g., demodulated respectively by the main and sub demodulators 30 and 50) in the first memory 70 respectively according to sync signals of the main and sub demodulators 30 and 50. The memory controller 60 can control the stored baseband video signals to be read by the video processor 80.

The video processor 80 preferably converts the read baseband video signals suitably for a display format. The second memory 90 can store PLL data for respective channels (for example, a VHF channel, a UHF channel, etc.).

The interference controller 210 can control an operation of the main and sub-tuners to select related channels to reduce or prevent interference therebetween. For example, when the user is viewing a channel selected through the main tuner but not a sub-window receiving for displaying a channel provided by the sub-tuner, the interference controller 210 can control the sub-tuner to a related channel that reduces or prevents interference with the main tuner.

For example, the interference controller 210 can read the respective channel PLL data, which can be stored in the second memory 90 or the like and thereby control the main and sub tuners 20 and 40 to respectively select desired channels.

Further, the interference controller 210 can determine whether a PIP function is on in a state where the broadcasting receiver is turned on. If the PIP function is on, the interference controller 210 can perform a general operation.

Otherwise, when the PIP function is off, the interference controller 210 can determine a channel frequency currently selected by the main tuner 20, and control the sub tuner 40 to select a bandwidth frequency not interfering with the main tuner 20. For example, the interference controller 210 can read PLL data of a scope not interfering with a currently-selected broadcast channel of the main tuner 20 among the PLL data stored in the second memory 90, and write the read PLL data (e.g., non-interfering) in the sub tuner 40.

As described above in embodiments of the invention, the interference controller 210 may be a separate controller. However, the present invention is not intended to be so limited. For example, the interference controller can be a general controller or the like of the broadcasting apparatus.

As described above in embodiments of the invention, the first memory 70 and second memory 90 are separate storage devices. However, the present invention is not intended to be so limited. For example, the first and second memories 70 and 90 can be combined as allocated or partitioned areas in a single memory. Alternatively, the first and second memories 70 and 90 can be included in one or both of the respective controllers 60 and 210.

As described above in embodiments of the invention, PLL data can be used to control or generate local oscillator signals for tuners of the broadcasting receiver. However, the present invention is not intended to be so limited. For example, other apparatus and methods can be used to generate the local oscillator signals and required corresponding data for the same can be managed, for example by the interference controller or the broadcasting apparatus.

Operations of the embodiment of the broadcasting receiver will now be described in detail. First, RF broadcasting signals received by the antenna can be supplied through the distributor 10 respectively to the main and sub tuners 20 and 40.

The main and sub tuners 20 and 40 can respectively control their local oscillation frequencies according to the PLL data from the interference controller 210. Thus, the main and sub tuners 20 and 40 can select desired channel RF signals, and then convert the selected channel RF signals into IF signals.

The main and sub demodulators 30 and 50 can respectively demodulate the IF signals from the tuners 20 and 40 into a baseband digital main video signal and a baseband digital sub video signal. The memory controller 60 can store the baseband digital main and sub video signals in the first memory 70 as a complex video signal according to sync signals supplied respectively from the demodulators 30 and 50.

The complex video signal stored in the first memory 70 can be supplied to the video processor 80 according to the control of the memory controller 60 and converted by the video processor 80 suitably for a display format. Then, the converted video signal can be displayed.

For example, when the PIP function is on, the main and sub video signals can be respectively converted suitably for the main and sub screens. Then, the converted main and sub video signals can be respectively displayed simultaneously on the main and sub screens.

Otherwise, when the PIP function is off, preferably only the main video signal is converted suitably for the main screen and then the converted main video signal is displayed on the main screen. The interference controller 210 can determine whether or not the PIP function is off in a state where the broadcasting receiver is turned on. Further, the interference controller 210 can determine whether or not a channel interval between the main and sub channels corresponds to an interference-causing channel interval in a state where the PIP function is off.

In one embodiment of the invention, the interference-causing channel interval is set to an interval of 7 channels (e.g., 42 MHz). However, the present invention is not intended to be so limited. For example, other broadcasting systems and receivers can use different bandwidths for channels, different allocations of frequencies to channels, different channel sets or different IF frequencies. Each of which can correspondingly effect an interference causing interval.

Accordingly, in the embodiment when the channel interfering interval between the two channels is an interval of 7 channels, PLL data of a frequency bandwidth channel reducing or preventing an interference with the main channel can be supplied to the sub tuner 40. That is, if the PIP function is off, PLL data supplied to the sub tuner 40 can be shifted to a frequency bandwidth reducing or not causing an interference with the main tuner 20 (for example, a frequency bandwidth beyond at least ±7 channel interval), whereby a frequency interference between the main and sub tuners 20 and 40 can be reduced or prevented.

For example, assume a currently-broadcast main channel is an 18th channel. Then, the interference controller 210 can read suitable PLL data from the second memory 90 and write the read PLL data in the sub tuner 40 so that an oscillation frequency corresponding to a channel beyond the eleventh through twenty-fifth channels can be generated.

Figure 4:
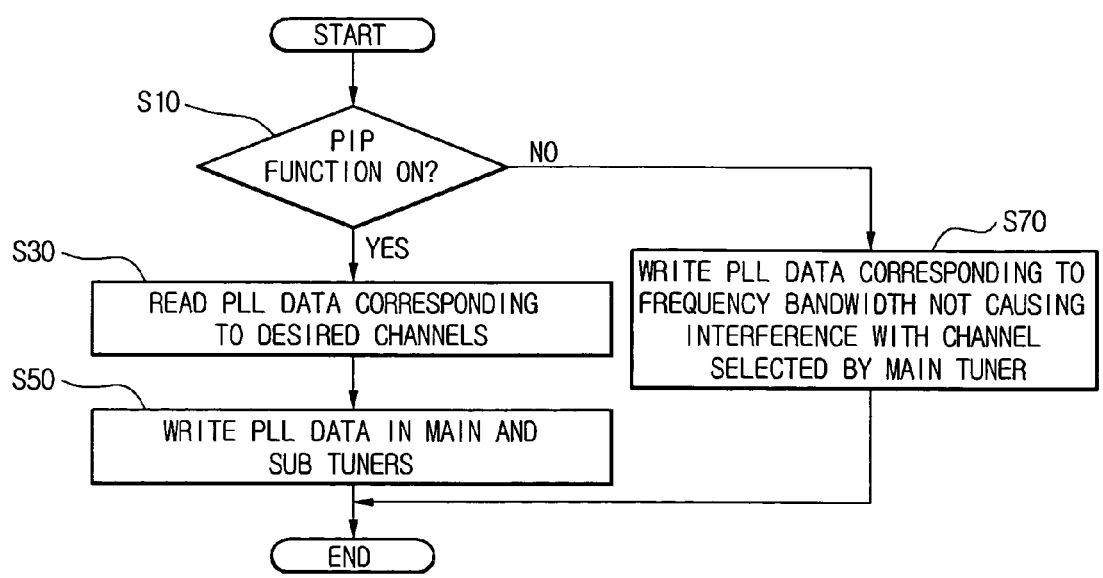
FIG. 4 is a flowchart illustrating an embodiment of a method for controlling a tuner in a broadcasting receiver according to the invention.

FIG. 4 is a flowchart illustrating a method for controlling a tuner in a broadcasting receiver according to a first embodiment of the invention. The embodiment of FIG. 4 can be described using and can be applied to the apparatus of FIG. 3. However, the present invention is not intended to be so limited.

As shown in FIG. 4, the interference controller can determine whether or not the PIP function of the broadcasting receiver is on (block S10). If the PIP function is determined to be on (block S10), the interference controller can read PLL data corresponding to desired channel frequencies from the second memory so that the main and sub tuners can respectively select desired channels (block S30).

In block S50, the interference controller can write the corresponding read PLL data respectively in the main and sub tuners. Accordingly, corresponding channel broadcasting signals can be properly displayed respectively on the main and sub screens.

Otherwise, when the PIP function is determined to be off (block S10), the interference controller 210 can determine a channel selected by the main tuner, and can determine or read PLL data corresponding to a bandwidth channel not causing an interference with the channel selected by the main tuner (e.g., PLL data beyond a ±7 channel interval in relation to a channel currently selected by the main tuner) and write the read PLL data in the sub tuner (block S70). Accordingly, an interference with a main video signal selected in a state where the PIP function is off, is not generated or reduced by using the embodiment of FIG. 4.

Figure 5:
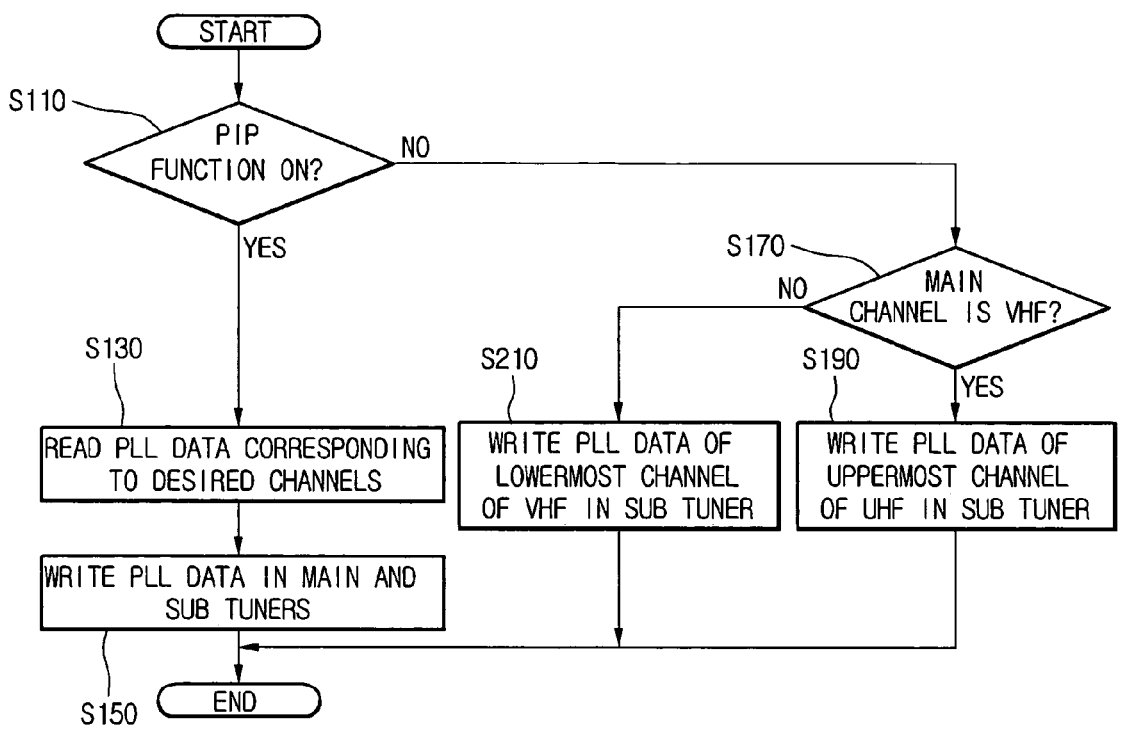
FIG. 5 is a flowchart illustrating another embodiment of a method for controlling a tuner in a broadcasting receiver according to the invention.

FIG. 5 is a flowchart illustrating a method for controlling a tuner in a broadcasting receiver according to a second embodiment of the invention. The embodiment of FIG. 5 can be described using and can be applied to the apparatus of FIG. 3. However, the present invention is not intended to be so limited.

In the second embodiment shown in FIG. 5, PLL data can be supplied to the sub tuner suitably according to whether a channel bandwidth selected by the main tuner is a VHF bandwidth or a UHF bandwidth when the PIP function is off. For example, when the channel bandwidth selected by the main tuner is the VHF bandwidth, PLL data corresponding to the uppermost bandwidth of the UHF bandwidth can be supplied to the sub tuner. When the channel bandwidth selected by the main tuner is the UHF bandwidth, PLL data corresponding to the lowermost bandwidth of the VHF bandwidth can be supplied to the sub tuner.

Accordingly, a local oscillation frequency difference between the main and sub tuners can be increased or maximized. Thus, an interference between the main and sub channels can be reduced or minimized.

Figure 6:
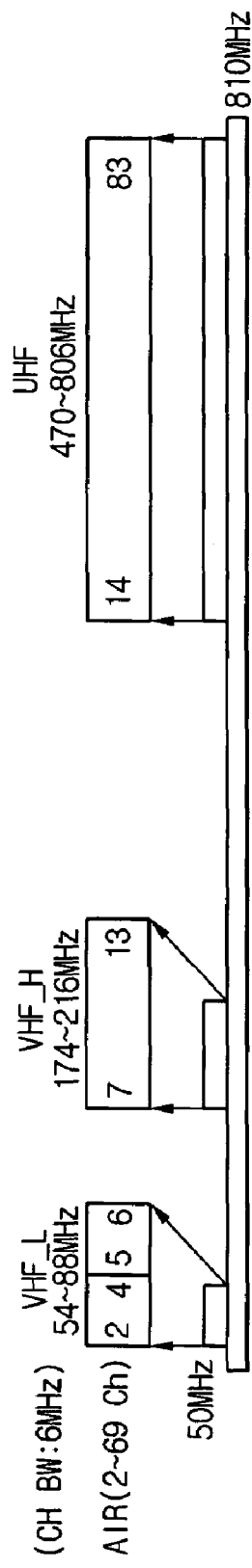
FIG. 6 is a diagram illustrating exemplary radio wave channels received by a broadcasting receiver.

FIG. 6 is a diagram illustrating exemplary radio wave channels received by a broadcasting receiver. As shown in FIG. 6, a broadcast wave can be classified into a VHF wave and a UHF wave. VHF channels can be 12 channels (e.g., second through thirteenth channels), and UHF channels can be 70 channels (e.g., fourteenth through eighty-third channels). However, about 47 channels may preferably be used to reduce or prevent an adjacent channel interference.

As shown in FIG. 5, the interference controller can determine whether the PIP function of the broadcasting receiver is on (block S110). If the PIP function is determined to be on (block S110), the interference controller can read PLL data of the main and sub tuners from the second memory (block S130).

The interference controller can then write the read PLL data respectively in the main and sub tuners. Accordingly, main and sub video signals are properly displayed respectively on the main and sub screens (block S150).

When the PIP function is determined to be off (block S110), the interference controller can further determine whether a frequency bandwidth of the main channel is a VHF bandwidth or a UHF bandwidth (block S170).

When the frequency bandwidth of the main channel is determined to be the VHF bandwidth (block S170), PLL data corresponding to the uppermost bandwidth of the UHF bandwidth can be written in the sub tuner (block S190). For example, although the uppermost channel (e.g., the 13th channel) of the VHF bandwidth has been selected as a current main channel, a frequency interference area can be avoided if PLL data corresponding to the uppermost channel (e.g., the eighty-third channel) of the UHF bandwidth is written in the sub tuner.

When, the frequency bandwidth of the main channel is determined to be the UHF bandwidth (block S170), PLL data corresponding to the lowermost bandwidth of the VHF bandwidth can be written in the sub tuner (block S210). For example, although the lowermost channel (e.g., the fourteenth channel) of the UHF bandwidth has been selected as a current main channel, a frequency interference area can be avoided if PLL data corresponding to the lowermost channel (e.g., the second channel) of the VHF bandwidth is written in the sub tuner.

In another embodiment according to the invention, separate PLL data is preferably not written in the sub tuner when the main channel is within the VHF bandwidth. This is because a sub channel having a channel interval (e.g., 42 MHz) causing an interference does not exist when the main channel is within the VHF bandwidth, (e.g., as shown in FIG. 6). For example, although the seventh channel of the VHF bandwidth and the fourteenth channel of the UHF bandwidth shown in FIG. 6 have a channel interval of 7 channels therebetween, they do not actually cause an interference because they actually have a channel interval of 42 MHz or more therebetween.

Further, if the main channel is within the UHF bandwidth, PLL data of the VHF bandwidth or PLL data beyond a prescribed-channel 7-channel (e.g., 42 MHz) interval can be written in the sub tuner. For example, since the uppermost channel of the VHF bandwidth and the lowermost channel of the UHF bandwidth have a channel interval of 42 MHz or more therebetween, if the main channel is within the UHF bandwidth, an interference can be reduced or prevented by merely writing PLL data within the VHF bandwidth in the sub tuner. Accordingly, an interference with the selected main video signal can be reduced or prevented even while the PIP function is off.

Although embodiments of a broadcasting receiver and control methods therefore having the PIP function has been described, embodiments of the invention may also be applied to any broadcasting receiver that includes at least two or more tuners or can simultaneously display broadcasting signals of at least two or more channels.

Any reference in this specification to "one embodiment" "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

As described above, embodiments of a broadcasting receiver or apparatus and control methods for the same have various advantages. For example, embodiments according to the invention can make a local oscillation frequency of a sub tuner (e.g., or local oscillation frequencies of sub tuners) not be located in a video signal bandwidth of a main channel. Further, embodiments of the invention do not add an additional component to the broadcasting receiver having plural tuners. In addition, embodiments of the invention can reduce or prevent an interference between first and second tuners (e.g., main and sub tuners), for example, fir a PIP or POP function.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A broadcasting receiver having at least two tuners and a function capable of simultaneously displaying broadcasting signals of at least two channels, the broadcasting receiver comprising:
   a plurality of tuners configured to convert RF signals selected from among a plurality of received RF signals into IF signals;
   a plurality of demodulators configured to demodulate the IF signals from the tuners to output video signals; and
   an interference controller configured to read data used to control oscillation frequencies for respective channels to select a specific channel with reference to a channel frequency of a currently selected and displayed broadcasting signal and to operate at least one other tuner according to the read data when a broadcasting signal received by said at least one other tuner is not displayed, and wherein the interference controller supplies a PLL data of a frequency bandwidth channel reducing or preventing an interference with the selected channel to said at least one other tuner.

2. The broadcasting receiver according to claim 1, wherein the currently selected and displayed broadcasting signal received by one tuner is the only displayed broadcasting signal.

3. The broadcasting receiver according to claim 1, wherein the interference controller writes PLL data of the selected specific channel configured to cause reduced interference with the channel frequency of the currently selected and displayed broadcasting signal in said at least one other tuner.

4. The broadcasting receiver according to claim 3, wherein the interference controller does not modify the PLL data in said at least one other tuner when the channel frequency of the currently selected and displayed broadcasting signal is within a VHF bandwidth.

5. The broadcasting receiver according to claim 1, wherein the interference controller writes PLL data corresponding to a UHF bandwidth in said at least one other tuner when the channel frequency of the currently selected and displayed broadcasting signal is within a VHF bandwidth.

6. The broadcasting receiver according to claim 5, wherein the interference controller writes PLL data corresponding to an uppermost bandwidth of the UHF bandwidth in said at least one other tuner.

7. The broadcasting receiver according to claim 1, wherein the interference controller writes PLL data corresponding to a VHF bandwidth in said at least one other tuner when the channel frequency of the currently selected and displayed broadcasting signal is within a UHF bandwidth.

8. The broadcasting receiver according to claim 7, wherein the interference controller writes the PLL data corresponding to a lowermost bandwidth of the VHF bandwidth in said at least one other tuner.

9. The broadcasting receiver according to claim 1, wherein the interference controller writes PLL data corresponding to a VHF bandwidth or the PLL data corresponding to a set channel interval in a UHF bandwidth causing reduced interference with the channel frequency of the currently selected and displayed broadcasting signal in said at least one other tuner when the channel frequency of the currently selected and displayed broadcasting signal is within the UHF bandwidth.

10. The broadcasting receiver according to claim 1, wherein the broadcasting receiver is configured to perform multi-window functions including a picture in picture (PIP) function, a picture-of-picture (POP) function or a function driving a plurality of sub-windows.

11. A broadcasting receiver having a plurality of tuners and a function capable of simultaneously displaying a first broadcasting signal and a second broadcasting signal respectively on first and second areas into which a display screen configured to be divided, the broadcasting receiver comprising:
   main and sub tuners configured to convert RF signals selected from among a plurality of RF signals received from an antenna into IF signals and to amplify the IF signals;
   main and sub demodulators configured to demodulate the IF signals from the tuners to output video signals; and
   an interference controller configured to store PLL data used to control oscillation frequencies to select specific channels and read corresponding PLL data selected to reduce interference caused by a channel frequency of the main tuner and write the corresponding PLL data in the sub tuner when a broadcasting signal output by the sub tuner is not displayed.

12. A tuner control method for a broadcasting receiver having a multi-tuner, the method comprising:
   controlling a selected channel bandwidth in a first tuner of a displayed first multi-window function; and
   controlling a second tuner of a second multi-window function with reference to the selected channel bandwidth when the second multi-window function is not displayed, wherein a PLL data of a frequency bandwidth channel reducing or preventing an interference with the first tuner is supplied to the second tuner.

13. The method according to claim 12, wherein the first multi-window function is a main screen and the second multi-window function is a picture in picture (PIP) function, a picture-of-picture (POP) function or a function driving one or more of sub-windows.

14. The method according to claim 12, wherein the controlling comprises writing PLL data, wherein the PLL data written in the second tuner reduces interference between the first and second tuners, and wherein the first tuner is a main tuner and the second tuner is a sub tuner.

15. The method according to claim 14, wherein the PLL data written in the sub tuner does not generate an interference with a channel frequency of the main tuner.

16. The method according to claim 14, wherein the PLL data written in the sub tuner is selected from a UHF bandwidth when a channel frequency of the main tuner is within a VHF bandwidth.

17. The method according to claim 16, wherein the PLL data written in the sub tuner corresponds to an uppermost bandwidth of the UHF bandwidth.

18. The method according to claim 16, wherein the PLL data written in the sub tuner is selected from the VHF bandwidth when a channel frequency of the main tuner is within the UHF bandwidth.

19. The method according to claim 14, wherein the PLL data is not modified in the sub tuner when a channel frequency of the main tuner is within a VHF bandwidth.

20. The method according to claim 14, wherein the PLL data corresponding to a VHF bandwidth or PLL data corresponding to a set channel interval in a UHF bandwidth causing a reduced interference with a channel frequency of the main tuner is written in the sub tuner when the channel frequency of the main tuner is within the UHF bandwidth.

* * * * *